(12) United States Patent
Kim et al.

(10) Patent No.: US 11,716,868 B2
(45) Date of Patent: Aug. 1, 2023

(54) ORGANIC LIGHT EMITTING DISPLAY APPARATUS

(71) Applicant: LG Display Co., Ltd., Seoul (KR)

(72) Inventors: Pureum Kim, Paju-si (KR); Yeonsuk Kang, Paju-si (KR); Hye-Jin Gong, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 189 days.

(21) Appl. No.: 17/121,228

(22) Filed: Dec. 14, 2020

(65) Prior Publication Data
US 2021/0202886 A1   Jul. 1, 2021

(30) Foreign Application Priority Data
Dec. 31, 2019   (KR) .................. 10-2019-0180175

(51) Int. Cl.
*H10K 59/123* (2023.01)
*H10K 50/818* (2023.01)
*H10K 59/124* (2023.01)
*H10K 71/00* (2023.01)
*H10K 59/12* (2023.01)

(52) U.S. Cl.
CPC ......... *H10K 50/818* (2023.02); *H10K 59/123* (2023.02); *H10K 59/124* (2023.02); *H10K 71/00* (2023.02); *H10K 59/1201* (2023.02)

(58) Field of Classification Search
CPC ........ H01L 27/1214–1296; H01L 27/32–3293
See application file for complete search history.

(56) References Cited

U.S. PATENT DOCUMENTS

| | | |
|---|---|---|
| 9,966,554 B2 | 5/2018 | Lee et al. |
| 10,367,046 B2 | 7/2019 | Lee et al. |
| 2001/0015626 A1* | 8/2001 | Ozawa ............... H01L 27/3276 315/168 |
| 2002/0104995 A1* | 8/2002 | Yamazaki ............ H01L 27/124 257/E27.113 |
| 2005/0057460 A1* | 3/2005 | Lee ..................... H01L 27/3258 345/76 |
| 2007/0257253 A1* | 11/2007 | Im ...................... H01L 27/3258 257/40 |
| 2015/0028315 A1* | 1/2015 | Nishimura .......... H10K 50/813 438/46 |
| 2019/0006618 A1* | 1/2019 | Sonoda ................ H05B 33/04 |
| 2019/0393285 A1* | 12/2019 | Kato ..................... H05B 33/02 |

FOREIGN PATENT DOCUMENTS

| KR | 10-1795579 B1 | 11/2017 |
|---|---|---|
| KR | 10-1980781 B1 | 5/2019 |

* cited by examiner

*Primary Examiner* — Bryan R Junge
(74) *Attorney, Agent, or Firm* — Birch, Stewart, Kolasch & Birch, LLP

(57) ABSTRACT

An organic light emitting display apparatus can include an insulating film disposed on a substrate, a first electrode disposed on the insulating film, an organic light emitting layer disposed on the first electrode, and a second electrode disposed on the organic light emitting layer, wherein the first electrode can be provided with a contact area that covers a contact hole passing through the insulating film, and a protrusion vertically protruded from an upper surface of the first electrode on a boundary surface of the contact hole.

16 Claims, 12 Drawing Sheets

ORGANIC LIGHT EMITTING DISPLAY APPARATUS

CROSS-REFERENCE TO RELATED APPLICATIONS

This application claims the priority benefit under 35 U.S.C. § 119(a) of Korean Patent Application No. 10-2019-0180175 filed on Dec. 31, 2019 in the Korean Intellectual Property Office, the entire contents of which are hereby expressly incorporated by reference into the present application.

BACKGROUND

Technical Field

The present disclosure relates to an organic light emitting display apparatus.

Description of the Related Art

With the advancement of the information age, the demand for a display apparatus for displaying an image has increased with various forms. Therefore, various types of display apparatuses such as a liquid crystal display (LCD) apparatus, a plasma display panel (PDP), and an organic light emitting display (OLED) apparatus have been recently used.

Among such display apparatuses, the organic light emitting display apparatus is a self-luminance display apparatus using an organic light emitting element which injects holes from an anode and electrons from a cathode into a light emitting layer and emits light when an exciton generated by recombination of the injected holes and electrons changes its state from an excited state to a ground state.

The organic light emitting display apparatus can be categorized into a top emission type, a bottom emission type, and a dual emission type depending on a direction of emitted light, and can be categorized into a passive matrix type and an active matrix type depending on a driving method.

The organic light emitting display apparatus does not need a separate light source unlike a liquid crystal display (LCD) apparatus and thus, can be manufactured into a lightweight and thin form. Further, the organic light emitting display apparatus is advantageous in terms of power consumption since it is driven with a low voltage. Also, the organic light emitting display apparatus has excellent color expression ability, a high response speed, a wide viewing angle, and a high contrast ratio (CR). Therefore, the organic light emitting display apparatus has been researched as a next-generation display apparatus.

Meanwhile, a head mounted display (HMD) including such an organic light emitting display apparatus has been recently developed. The head mounted display (HMD) can provide a service of virtual reality (VR) or augmented reality (AR), which forms a focal point on a close distance in front of eyes of a user who wears the HMD in glasses or helmet type. However, in order to embody a micro organic light emitting display apparatus of ultra-high resolution, problems to be addressed exist.

BRIEF SUMMARY

The present disclosure has been made in view of the above problems and other limitations associated with the background art, and it is an object of the present disclosure to provide an organic light emitting display apparatus that can minimize luminescence of unwanted subpixels due to a leakage current by improving a contact area of an organic light emitting diode, thereby embodying a micro organic light emitting display apparatus of ultra-high resolution.

In addition to the objects of the present disclosure as mentioned above, additional objects and features of the present disclosure will be clearly understood by those skilled in the art from the following description of the present disclosure.

In accordance with an aspect of the present disclosure, the above and other objects can be accomplished by the provision of an organic light emitting display apparatus comprising an insulating film disposed on a substrate, a first electrode disposed on the insulating film, an organic light emitting layer disposed on the first electrode, and a second electrode disposed on the organic light emitting layer, wherein the first electrode can be provided with a contact area that covers a contact hole passing through the insulating film, and a protrusion vertically protruded from an upper surface of the first electrode on a boundary surface of the contact hole.

In accordance with another aspect of the present disclosure, the above and other objects can be accomplished by the provision of a method for manufacturing an organic light emitting display apparatus comprising forming a transistor disposed on a substrate, forming a planarization film having a lower contact hole on the transistor, forming a connection electrode electrically connected with the transistor through the lower contact hole on the planarization film by patterning, forming a first electrode having a contact area covering the contact hole on the insulating film and a protrusion vertically protruded on a boundary surface of the contact hole, forming a fence film on the insulating film on which the first electrode is patterned, to cover an edge area of the first electrode, forming an organic light emitting layer on the first electrode and the fence film, and forming a second electrode on the organic light emitting layer.

In the organic light emitting display apparatus according to the present disclosure, a contact area of an organic light emitting diode can be improved, whereby luminescence of unwanted subpixels due to a leakage current can be minimized. Also, since an interval between pixels can be minimized, a micro organic light emitting display apparatus of ultra-high resolution can be embodied.

In addition to the effects of the present disclosure as mentioned above, additional objects and features of the present disclosure will be clearly understood by those skilled in the art from the following description of the present disclosure.

BRIEF DESCRIPTION OF THE DRAWINGS

The above and other objects, features and other advantages of the present disclosure will be more clearly understood from the following detailed description taken in conjunction with the accompanying drawings, in which.

DETAILED DESCRIPTION OF THE EMBODIMENTS

Figure 1:
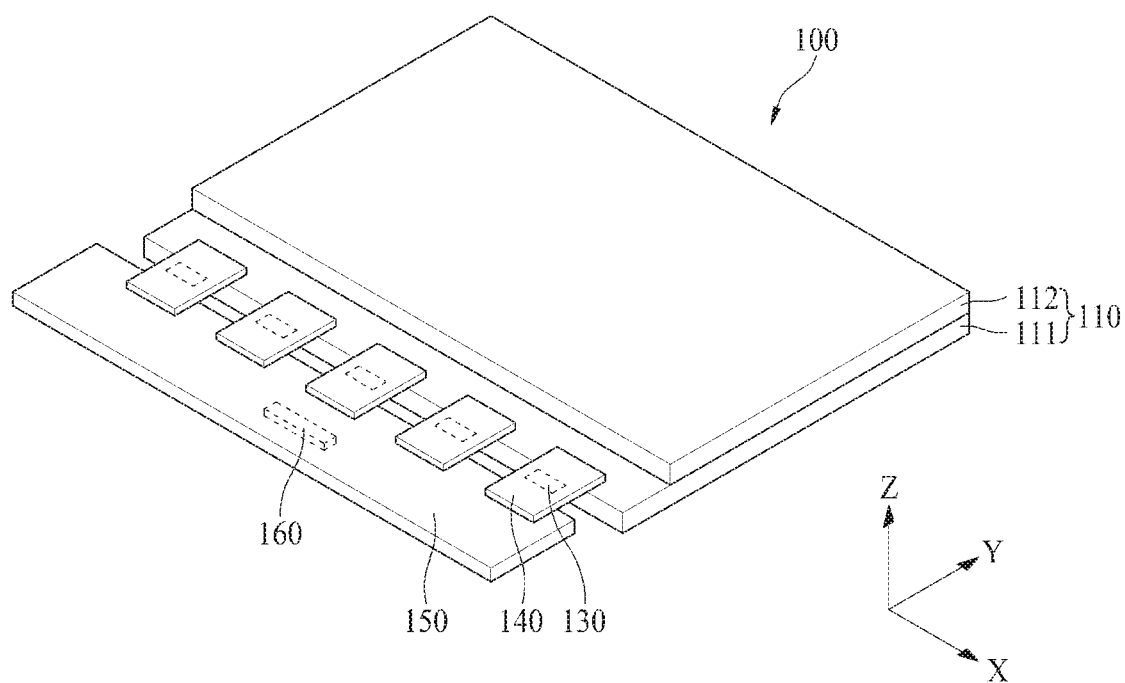
FIG. 1 is a schematic perspective view illustrating an organic light emitting display apparatus according to various embodiments of the present disclosure.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part can be added unless 'only-' is used. The terms of a singular form can include plural forms unless referred to the contrary.

In construing an element, the element is construed as including an error range although there is no explicit description.

In describing a position relationship, for example, when the position relationship is described as 'upon-', 'above-', 'below-', and 'next to-', one or more portions can be arranged between two other portions unless 'just' or 'direct' is used.

In describing a temporal relationship, for example, when the temporal order is described as "after," "subsequent," "next," and "before," a case which is not continuous can be included, unless "just" or "direct" is used.

It will be understood that, although the terms "first", "second", etc. can be used herein to describe various elements, these elements should not be limited by these terms. These terms are only used to partition one element from another and may not define order. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and can be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure can be partially or overall coupled to or combined with each other, and can be variously inter-operated with each other and driven technically as those skilled in the art can sufficiently understand. The embodiments of the present disclosure can be carried out independently from each other, or can be carried out together in co-dependent relationship.

Hereinafter, a preferred embodiment of an organic light emitting display apparatus according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

Figure 2:
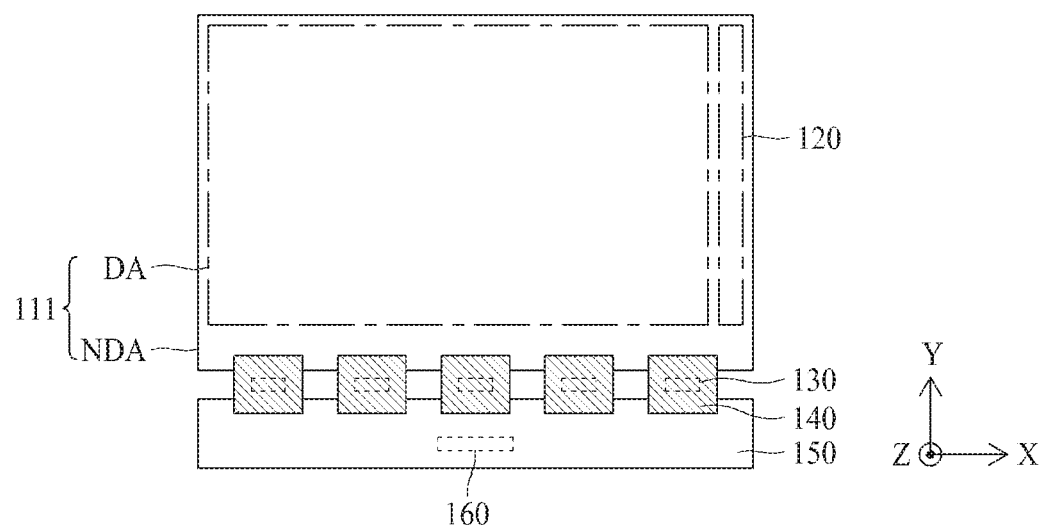
FIG. 2 is a plane view illustrating a first substrate, a gate driver, a source drive IC, a flexible film, a circuit board, and a timing controller of FIG. 1.

FIG. 1 is a schematic perspective view illustrating an organic light emitting display apparatus according to various embodiments of the present disclosure, and FIG. 2 is a plane view illustrating a first substrate, a gate driver, a source drive IC, a flexible film, a circuit board, and a timing controller of FIG. 1. All components of the organic light emitting display apparatus according to all embodiments of the present disclosure are operatively coupled and configured.

Referring to FIGS. 1 and 2, an organic light emitting display apparatus 100 according to various embodiments of the present disclosure can include a display panel 110, a gate driver 120, a source drive integrated circuit (IC) 130, a flexible film 140, a circuit board 150, and a timing controller 160.

The display panel 110 can include a first substrate 111 and a second substrate 112. The second substrate 112 can be an encapsulation substrate. The first substrate 111 can be a silicon wafer substrate formed using a semiconductor process. Alternatively, the first substrate 111 can be a plastic film or a glass substrate. The second substrate 112 can be a plastic film, a glass substrate, or an encapsulation film. In various embodiments of the present disclosure, the second substrate 112 can be omitted.

Gate lines, data lines, and pixels can be formed on one surface of the first substrate 111 facing the second substrate 112. The pixels can be provided in an area defined by an intersection structure of the gate lines and the date lines.

Each of the pixels can include a light emitting diode that includes a transistor, a first electrode, an organic light emitting layer, and a second electrode. Each of the pixels can supply a predetermined current to the organic light emitting diode in accordance with a data voltage of the data line when a gate signal from the gate line is input thereto using the transistor. For this reason, the organic light emitting diode of each of the pixels can emit light with a predetermined brightness in accordance with the predetermined current.

The display panel 110, as shown in FIG. 2, can be categorized into a display area DA where pixels are formed to display an image, and a non-display area NDA that does not display an image. The gate lines, the data lines, and the pixels can be formed in the display area DA. A gate driver 120 and pads can be formed in the non-display area NDA.

The gate driver 120 can supply gate signals to the gate lines in accordance with to a gate control signal input from the timing controller 160. The gate driver 120 can be formed in the non-display area NDA outside one side or both sides of the display area DA of the display panel 110 in a gate driver-in-panel (GIP) type. Alternatively, the gate driver 120 can be manufactured as a driving chip, can be packaged in a flexible film, and can be attached to the non-display area NDA outside one side or both sides of the display area DA of the display panel 110 in a tape automated bonding (TAB) type.

The source drive IC 130 can receive digital video data and a source control signal from the timing controller 160. The source drive IC 130 can convert the digital video data into analog data voltages in accordance with the source control signal, and can supply the analog data voltages to the data lines. If the source drive IC 130 is manufactured as a driving chip, the source drive IC 130 can be packaged in the flexible film 140 in a chip-on-film (COF) type or a chip-on-plastic (COP) type.

Pads, such as data pads, can be formed in the non-display area NDA of the display panel 110. Lines connecting the pads with the source drive IC 130 and lines connecting the pads with lines of the circuit board 150 can be formed in the flexible film 140. The flexible film 140 can be attached onto the pads using an anisotropic conducting film, whereby the pads can be connected with the lines of the flexible film 140.

The circuit board 150 can be attached onto the flexible films 140. A plurality of circuits embodied as driving chips can be packaged in the circuit board 150. For example, the timing controller 160 can be packaged in the circuit board 150. The circuit board 150 can be a printed circuit board or a flexible printed circuit board.

The timing controller 160 can receive the digital video data and a timing signal from an external system board through a cable of the circuit board 150. The timing controller 160 can generate a gate control signal for controlling an operation timing of the gate driver 120 and a source control signal for controlling the source drive ICs 130 based on the timing signal. The timing controller 160 can supply the gate control signal to the gate driver 120, and can supply the source control signal to the source drive ICs 130.

Figure 3A:
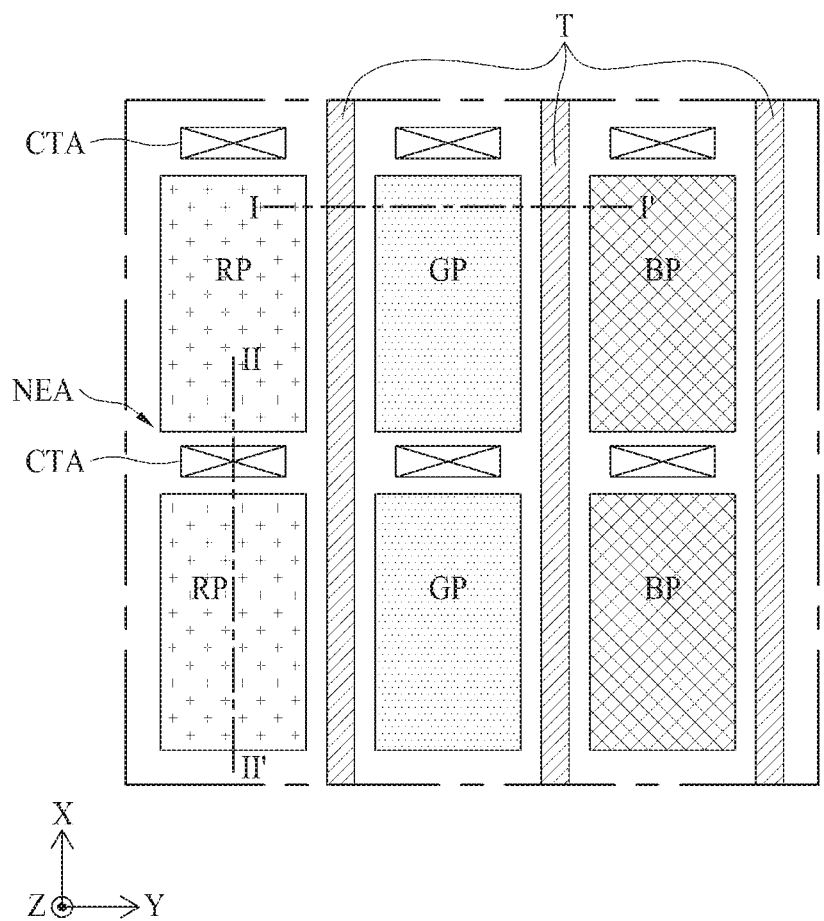
FIGS. 3A and 3B are plane views illustrating subpixels of a display area according to various embodiments of the present disclosure.
Figure 3B:
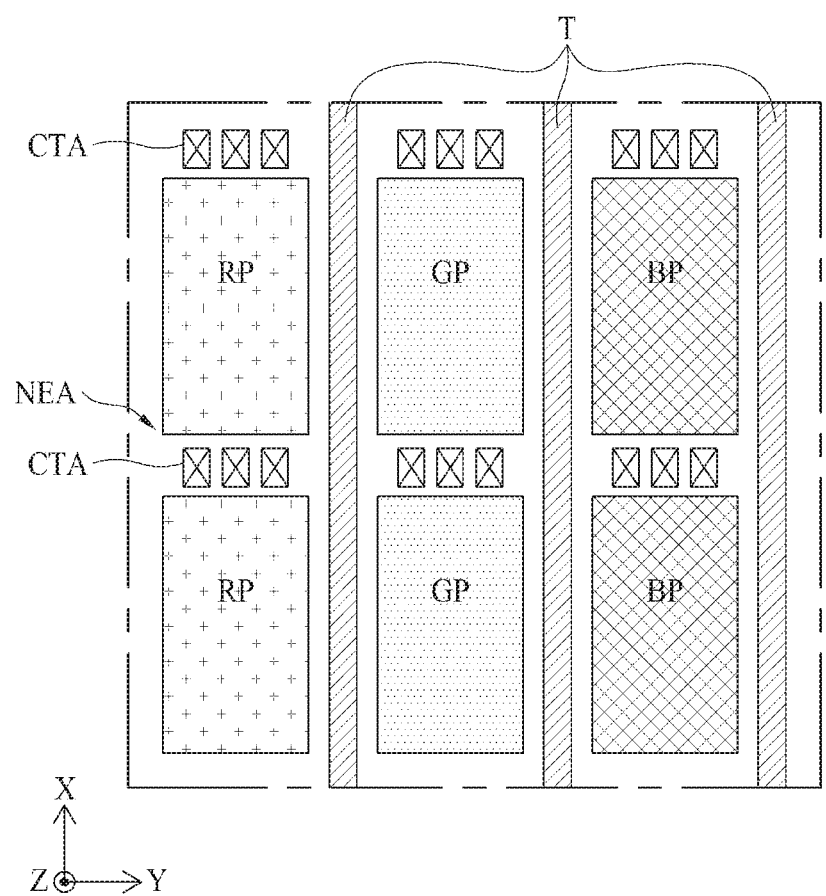

FIGS. 3A and 3B are plane views illustrating subpixels of a display area according to various embodiments of the present disclosure. For convenience of description, FIGS. 3A and 3B only show red, green and blue pixels RP, GP and BP, a non-emission area (NEA), a contact area (CTA), and a trench (T).

Referring to FIGS. 3A and 3B, each of the pixels RP, GP and BP can include at least one transistor and an organic light emitting diode.

The transistor can include an active layer, a gate electrode overlapped with the active layer, a source electrode connected to one side of the active layer, and a drain electrode connected to the other side of the active layer. Alternatively, the transistor can be embodied as a complementary metal-oxide semiconductor (CMOS) circuit based on a CMOS process on a silicon wafer substrate.

The organic light emitting diode can include a first electrode corresponding to an anode electrode, an organic light emitting layer, and a second electrode corresponding to a cathode electrode.

For the respective pixels RP, GP and BP, the first electrode, the organic light emitting layer, and the second electrode can sequentially be deposited and holes from the first electrode and electrons from the second electrode can be combined with each other in the organic light emitting layer to emit predetermined light. The pixels RP, GP and BP can include a red pixel RP capable of emitting red light, a green pixel GP capable of emitting green light, and a blue pixel BP capable of emitting blue light.

The non-emission area NEA can be provided at edges of the pixels RP, GP and BP to partition the pixels RP, GP and BP. A fence film can be disposed in the non-emission area NEA according to the present disclosure. For example, the pixels RP, GP and BP can be partitioned by the fence film.

The contact area CTA is a portion where a contact (electric connection) between a source or drain electrode of the transistor and the first electrode of the organic light emitting diode is performed. A contact hole for electric connection with the transistor can be formed in the contact area CTA, and the first electrode can be formed to cover the contact hole. A protrusion vertically protruded from an upper surface of the first electrode can be formed on a boundary surface of the contact hole. The fence film can be formed to be extended to cover the contact area. As shown in FIG. 3A, the contact area CTA can be embodied as one contact hole extended to a first direction (e.g., X direction) of the respective pixels RP, GP and BP. Alternatively, as shown in FIG. 3B, the contact area CTA can be embodied a plurality of contact holes disposed in a first direction (e.g., X direction) of the respective pixels RP, GP and BP. A detailed structure of the contact area CTA will be described later with reference to FIGS. 5A and 5B and FIGS. 6A to 6C.

The trench T can be formed to be recessed toward a surface at a certain depth and width in a second direction (e.g., Y direction) in the non-emission area NEA among the pixels RP, GP and BP. For example, the trench T can be provided in the non-emission area NEA between the red pixel RP and the green pixel GP to partition an area between the red pixel RP and the green pixel GP. Also, the trench T can be provided in the non-emission area NEA between the green pixel GP and the blue pixel BP to partition an area between the green pixel GP and the blue pixel BP. A detailed structure of the trench T will be described later with reference to FIG. 4.

In various embodiments of the present disclosure, the organic light emitting layer can be formed in red, green and blue pixels RP, GP and BP as a common layer to emit white light. In this case, in order that the red pixel RP can emit red light, the green pixel GP can emit green light, and the blue pixel BP can emit blue light, color filters can be required. For example, a red color filter can be disposed to correspond the red pixel RP, a green color filter can be disposed to correspond to the green pixel GP, and a blue color filter can be disposed to correspond to the blue pixel BP. As shown in FIGS. 3A and 3B, if the red pixel RP, the green pixel GP and the blue pixel BP exist, the red pixel RP, the green pixel GP and the blue pixel BP can be defined as one unit pixel. However, the example of the present disclosure is not limited to this example, and a white subpixel can be added. In this case, a red subpixel, a green subpixel, a blue subpixel and the white subpixel can be defined as one unit pixel.

Figure 4:
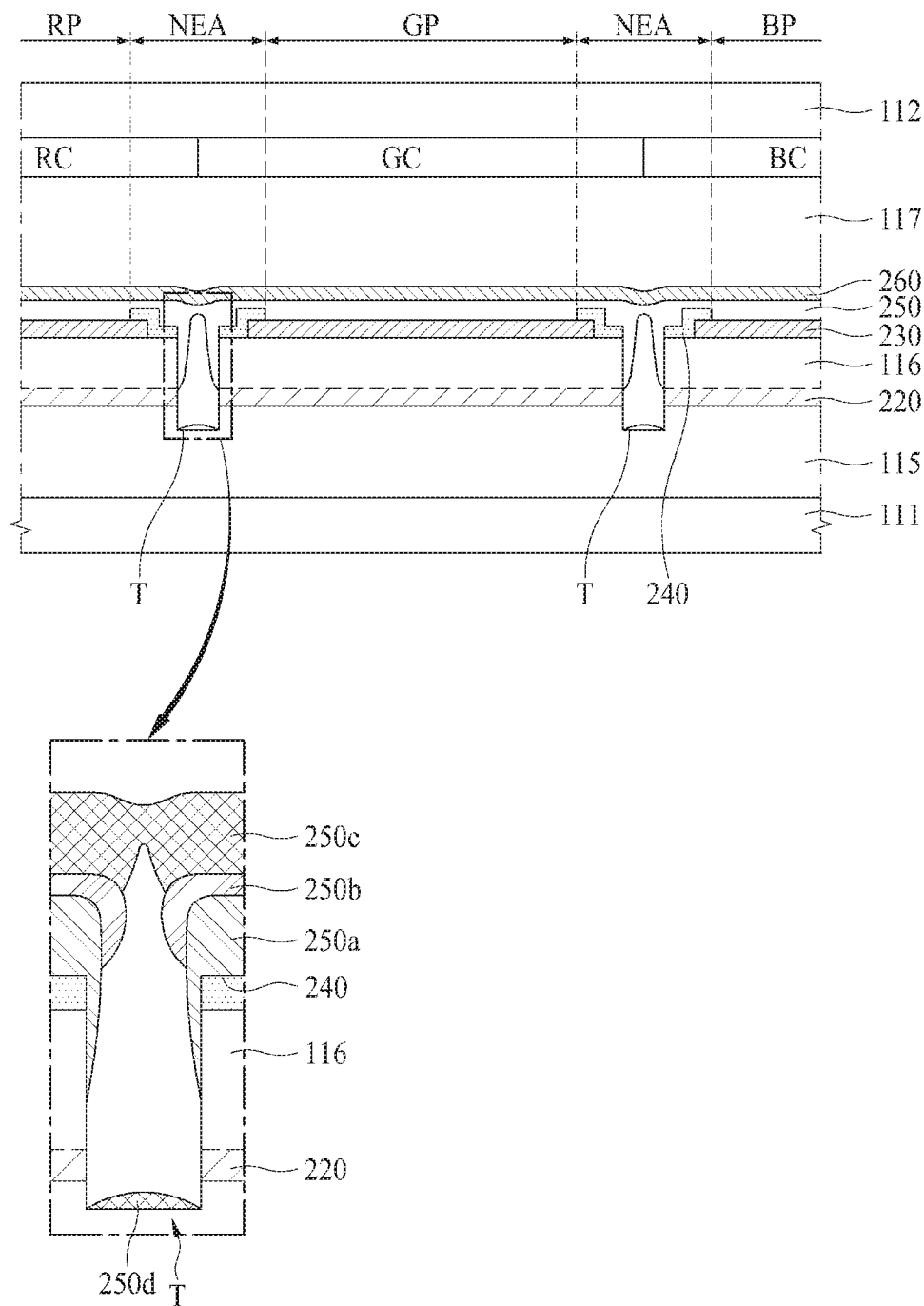
FIG. 4 is a cross-sectional view taken along line I-I' of FIG. 3A.

FIG. 4 is a cross-sectional view taken along line I-I' of FIG. 3A. FIG. 4 shows a sectional structure of pixels RP, GP and BP in an area which is not overlapped with the contact area CTA.

Referring to FIG. 4, the organic light emitting display apparatus according to various embodiments of the present disclosure can include a first substrate 111, a planarization film 115, a connection electrode 220, an insulating film 116, a first electrode 230, a fence film 240, an organic light emitting layer 250, a second electrode 260, an encapsulation layer 117, color filter layers RC, GC and BC and a second substrate 112.

The organic light emitting display apparatus can include a first substrate 111 and a second substrate 112. The first substrate 111 can be referred to as a transistor substrate or a backplane. The second substrate 112 can be referred to as a color filter substrate or an opposite substrate. In various embodiments of the present disclosure, the second substrate 112 can be omitted.

The first substrate 111 can be a silicon wafer substrate formed using a semiconductor process, or can be a plastic film or a glass substrate. The first substrate 111 can include gate lines, data lines, and transistors. The gate lines can be disposed to cross the data lines. The gate lines can be connected to the gate driver to receive gate signals, and the data lines can be connected to the data driver to receive data voltages. In various embodiments of the present disclosure, if the first substrate 111 is a silicon wafer substrate, the first substrate 111 can be embodied as a CMOS circuit in which gate lines, data lines and a transistor are integrated by a CMOS process. The planarization film 115 that protects the transistor and planarizes an upper portion of the substrate 111 can be formed on the first substrate 111.

The connection electrode 220 can be formed on the planarization film 115. In FIG. 4, the connection electrode 220 which is not overlapped with the contact area CTA may not be disposed in a corresponding sectional area. An insulating film 116 can be formed on the planarization film 115 and the connection electrode 220.

The first electrode 230 can be formed on the insulating film 116. The first electrode 230 can be an anode electrode, and can be formed of a conductive material having a relatively great work function value to serve to supply holes to the organic light emitting layer 250. The first electrode 230 can be a multi-layered structure that includes a transparent electrode layer capable of transmitting light and a reflective electrode layer. For example, the first electrode 230 can be made of a transparent electrode layer formed of a material such as indium tin oxide (ITO) and indium zinc oxide (IZO) and a reflective conductive material having excellent reflective efficiency, such as Al, Ag, Cu, Ni or their alloy. Preferably, the first second electrode 230 can be a multi-layered structure in which reflective electrode layers of APC (Ag/Pd/Cu) are sequentially deposited.

The fence film 240 covering a corner of the first electrode 230 can be formed at an edge area of the first electrode 230. For example, the fence film 240 partially covering a side and an upper surface of the first electrode 230 can be formed. The fence film 240 covers the first electrode 230 in which the non-emission area NEA is arranged, and the respective pixels RP, GP and BP can be partitioned by the fence film 240.

The organic light emitting layer 250 can be formed on the first electrode 230 and the fence film 240. The organic light emitting layer 250, as shown in a partially enlarged portion of FIG. 4, can include a hole transporting layer 250a, a light emitting layer 250b, and an electron transporting layer 250c. In this case, if a voltage is applied to the first electrode 230 and the second electrode 260, holes and electrons move to the light emitting layer 250b through the hole transporting layer 250a and the electron transporting layer 250c, whereby the holes and the electrons are combined with each other in the light emitting layer 250b.

The organic light emitting layer 250 can be a white light emitting layer emitting white light. In this case, the organic light emitting layer 250 can be a common layer commonly formed for the respective pixels RP, GP and BP. If the organic light emitting layer 250 is a white light emitting layer, the organic light emitting layer 250 can be formed with a tandem structure of two or more stacks. Each of the stacks can include a hole transporting layer 250a, at least one light emitting layer 250b, and an electron transporting layer 250c. Also, a charge generating layer can be formed between the stacks. The charge generating layer can include an N type charge generating layer disposed to adjoin a lower stack, and a P type charge generating layer formed on the n type charge generating layer and disposed to adjoin an upper stack. The N type charge generating layer can inject electrons into the lower stack, and the P type charge generating layer can inject holes into the upper stack. The N type charge generating layer can be made of an organic layer doped with alkali metal such as Li, Na, K or Cs or alkali earth metal such as Mg, Sr, Ba or Ra. The P type charge generating layer can be made of an organic material having hole transporting capability, which is doped with a dopant.

Meanwhile, the organic light emitting layer 250 can be made of light emitting layers that respectively emit red light, green light and blue light. In this case, color filter layers RC, GC and BC can be omitted.

The second electrode 260 can be formed on the organic light emitting layer 250. The second electrode 260 can be a common layer commonly formed for the respective pixels RP, GP and BP. The second electrode 260 can be formed of a transparent conductive material (TCP) such as ITO and IZO or a semi-transmissive conductive material such as Mg, Ag, or alloy of Mg and Ag. If the second electrode 260 is formed of a semi-transmissive conductive material, a micro cavity effect can be obtained.

The encapsulation layer 117 can be formed on the second electrode 260. The encapsulation layer 117 can serve to prevent oxygen or water from being permeated into the organic light emitting layer 250 and the second electrode 260. To this end, the encapsulation layer 117 can include at least one inorganic film and at least one organic film.

Color filter layers RC, GC and BC can be formed on the encapsulation layer 117. The color filter layers RC, GC and BC can respectively be disposed to correspond to the pixels RP, GP and BP. For example, the red color filter RC can be disposed to the red pixel RP, the green color filter GC can be disposed to correspond to the green pixel GP, and the blue color filter BC can be disposed to correspond to the blue pixel BP. The second substrate 112 can be disposed on the color filter layers RC, GC and BC.

According to various embodiments of the present disclosure, the trench T can be formed in the non-emission area NEA among the pixels RP, GP and BP. The trench T can be formed to pass through at least a portion of the insulating film 116 and the planarization film 115 and allow at least a portion of the insulating film 116 and the planarization film 115 to be recessed. In various embodiments of the present disclosure, the trench T can be formed to allow only a portion of the insulating film 116 to be recessed, or can be formed to pass through the insulating film 116 and the planarization film 115. The trench T can be provided in the non-emission area NEA between the red pixel RP and the green pixel GP to partition an area between the red pixel RP and the green pixel GP, or can also be provided in the non-emission area NEA between the green pixel GP and the blue pixel BP to partition an area between the green pixel GP and the blue pixel BP.

The trench T can be formed in a boundary among the pixels RP, GP and BP, for example, between the first electrodes 230 adjacent to each other, whereby a leakage current of the organic light emitting layer 250 formed on the first electrode 230 as a common layer can be minimized. For example, the trench T can be formed such that the organic light emitting layer 250 at a sidewall of the trench T can be disconnected from the organic light emitting layer 250 on the bottom of the trench T. For example, the organic light emitting layer 250 passes through the trench T and thus can allow a length of a current leakage path to be longer than a case that there is no trench T. Also, since the organic light emitting layer 250 at the sidewall of the trench T can be formed to be disconnected from the organic light emitting layer 250 on the bottom of the trench T, a leakage current through the organic light emitting layer 250 can be minimized.

In this way, the organic light emitting layer 250 can have a structure that a length of a current leakage path can be longer in the boundary among the pixels RP, GP and BP by the trench T or a structure that a current leakage current can be disconnected. If the organic light emitting layer 250 has a tandem structure in which a plurality of light emitting layers for emitting white light are deposited, as shown in the partially enlarged portion of FIG. 4, a multi-layered structure of a first stack 250a, a charge generating layer 250b and a second stack 250c can be formed. In detail, the organic light emitting layer 250 can include a first stack 250a, a second stack 250c, and a charge generating layer (CGL) 250b provided between the first stack 250a and the second stack 250c. The organic light emitting layer 250 can be formed inside the trench T and above the trench T. According to various embodiments, when the organic light emitting layer 250 is formed inside the trench T, at least a portion of the organic light emitting layer 250 can be disconnected, whereby occurrence of a leakage current among the adjacent pixels RP, GP and BP can be avoided.

At least one or two or more layers of the first stack 250a, the second stack 250c and the charge generating layer 250b, which constitute the organic light emitting layer 250, can be formed at a side inside the trench T, and can be formed on a lower surface inside the trench T.

At this time, based on a center portion of the trench T, a first portion of the first stack 250a formed at one side inside the trench T, for example, a left side and a second portion of the first stack 250a formed at the other side inside the trench T, for example, a right side are disconnected from each other without being connected with each other. Also, a third portion of the first stack 250a formed on the lower surface inside the trench T is disconnected from the first portion and the second portion of the first stack 250a formed at a side inside the trench T without being connected therewith. Therefore, charges cannot move among the pixels RP, GP and BP disposed to adjoin one another by interposing the trench T, through the first stack 250a.

Also, the charge generating layer 250b is formed on the first stack 250a. At this time, the charge generating layer 250b can be formed above the trench T without being extended to the inside of the trench T. For example, the charge generating layer 250b can be formed above an upper surface of one end of the insulating film 116 passing through by the trench T, for example, an upper surface of one end of the insulating film 116 adjoining the trench T. However, without limitation to this case, the charge generating layer 250b can be extended to reach the inside of the trench T.

At this time, based on the center portion of the trench T, a first portion of the charge generating layer 250b formed at one side of the trench T, for example, a left side and a second portion of the charge generating layer 250b formed at the other side of the trench T, for example, a right side are disconnected from each other without being connected with each other. The first portion of the charge generating layer 250b is formed on the first portion of the first stack 250a, and the second portion of the charge generating layer 250b is formed on the second portion of the first stack 250a.

Therefore, charges cannot move among subpixels P1, P2 and P3 disposed to adjoin one another by interposing the trench T, through the charge generating layer 250b.

Also, the second stack 730 can be connected with another second stack 730 without being disconnected among the pixels RP, GP and BP disposed to adjoin one another by interposing the trench T on the charge generating layer 250b. For example, based on the center portion of the trench T, a first portion of the second stack 250c formed at one side of the trench T, for example, a left side and a second portion of the second stack 250c formed at the other side of the trench T, for example, a right side are connected with each other. Therefore, charges can move among the pixels RP, GP and BP disposed to adjoin one another by interposing the trench T, through the second stack 250c.

At this time, the second stack 250c corresponding to the trench T from which the charge generating layer 250b is disconnected can be formed at a thickness thinner than the second stack 250c corresponding to the area which is not overlapped with the trench T. In other words, a first thickness of the second stack 250c overlapped with the area between the first portion and the second portion of the charge generating layer 250b can be thinner than a second thickness of the first portion or the second portion of the second stack 250c overlapped with the insulating film 116.

In this way, the reason why that the first thickness of the second stack 250c is relatively thin is that the second stack 250c can be deposited to be spaced apart from each upper surface of the first portion and the second portion of the charge generating layer 250b and then formed to adjoin each upper surface. Therefore, a lower portion of the second stack 250c formed to be relatively thin can be provided to be partially disconnected from the upper portion of the trench T. For example, the lower portion of the first portion of the second stack 250c and the lower portion of the second portion of the second stack 250c can partially be disconnected from each other.

A gap is formed in the trench T by the aforementioned structure of the first stack 250a, the charge generating layer 250b and the second stack 250c. The gap is defined by the insulating layer 116 and the organic light emitting layer 250. Therefore, the gap can be provided below the organic light emitting layer 250. The charge generating layer 250b has conductivity greater than that of each of the first stack 250a and the second stack 250c. Particularly, since the N type charge generating layer constituting the charge generating layer 250b can include a metal material, the N type charge generating layer has conductivity greater than that of each of the first stack 250a and the second stack 250b. Therefore, among the pixels RP, GP and BP disposed to adjoin one another, charges mainly move through the charge generating layer 250b, and little move through the second stack 250c. Therefore, the charge generating layer 250b is provided to be disconnected inside the trench T, whereby movement of charges among the pixels RP, GP and BP disposed to adjoin one another can be reduced to avoid occurrence of a leakage current.

Meanwhile, although the trench T can be applied to a boundary area between the red pixel RP and the green pixel GP, between the green pixel GP and the blue pixel BP or between the blue pixel BP and the red pixel RP, which emit light of different colors, if the display panel is embodied with microminiaturization, it can be difficult to apply the trench T to a boundary area between the red pixel RP and the red pixel RP, between the green pixel GP and the green pixel GP, or between the blue pixel BP and the blue pixel BP, which emit light of the same color, due to a spatial limitation. For example, although a leakage current can be prevented from occurring among the adjacent pixels of different colors due to application of the trench T, a problem can occur in that a leakage current occurs among the pixels of the same color.

Hereinafter, an organic light emitting display apparatus that can minimize a leakage current while designing an interval between the same pixels to be narrow in accordance with various embodiments of the present disclosure will be described.

Figure 5A:
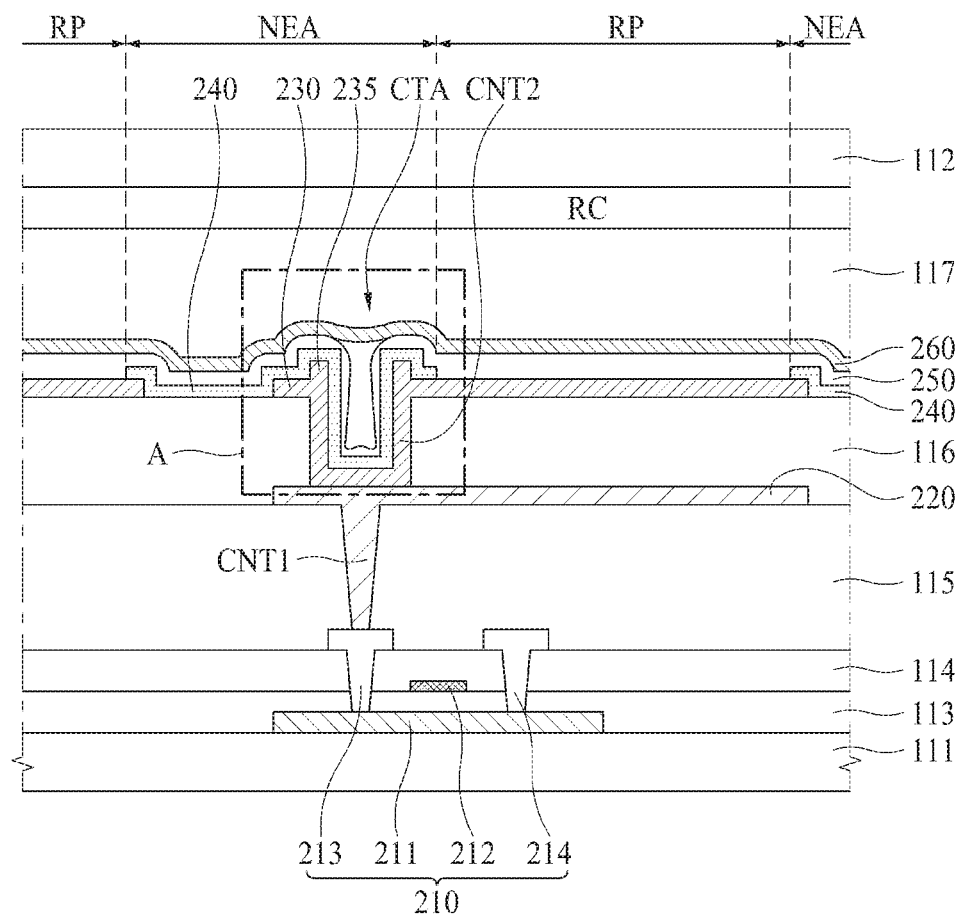
FIGS. 5A and 5B illustrate various examples of cross-sectional views taken along line II-II' of FIG. 3A.
Figure 5B:
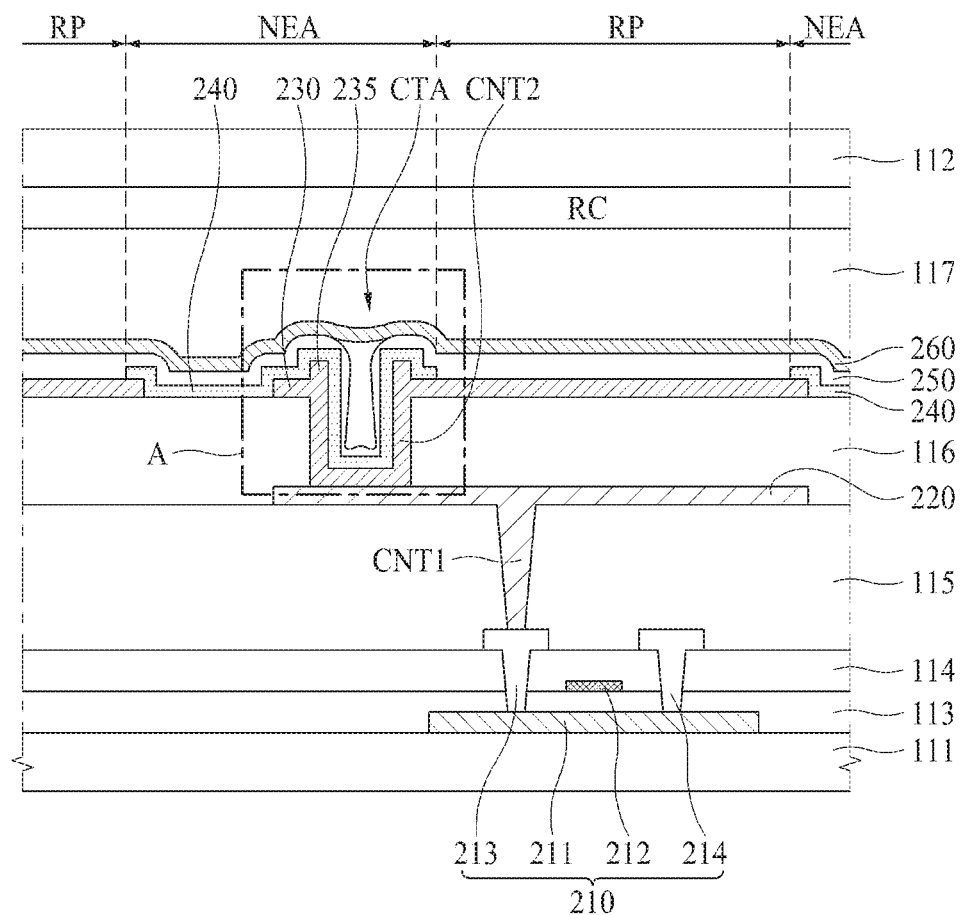

FIGS. 5A and 5B are cross-sectional views illustrating various examples of view taken along line II-II' of FIG. 3A. FIGS. 5A and 5B show sectional structures of pixels GP to which a contact area CTA improved to minimize a leakage current.

Referring to FIGS. 5A and 5B, he organic light emitting display apparatus according to various embodiments of the present disclosure can include a first substrate 111, a transistor 210, a gate insulating film 113, an inter-layer dielectric film 114, a planarization film 115, a connection electrode 220, an insulating film 116, a first electrode 230, a fence film 240, an organic light emitting layer 250, a second electrode 260, an encapsulation layer 117, a color filter layer GC, and a second substrate 112.

The organic light emitting display apparatus can include a first substrate 111 and a second substrate 112. The first substrate 111 can be referred to as a transistor substrate or a backplane. The second substrate 112 can be referred to as a color filter substrate or an opposite substrate. In various embodiments of the present disclosure, the second substrate 112 can be omitted.

The first substrate 111 can be a silicon wafer substrate formed using a semiconductor process, or can be a plastic film or a glass substrate. The first substrate 111 can include gate lines, data lines, and transistors 210. A buffer layer for shielding external particles from being permeated and protecting various elements of the organic light emitting display apparatus can be formed on the substrate 111. The buffer layer, for example, can be formed of a single layer of SiOx or SiNx or multiple layers of SiOx and SiNx. The buffer layer can be omitted depending on a structure or characteristic of the organic light emitting display apparatus. In various embodiments of the present disclosure, if the first substrate 111 is a silicon wafer substrate, the first substrate 111 can be embodied as a CMOS circuit in which gate lines, data lines and a transistor are integrated by a CMOS process.

The transistor 210 can be formed on the first substrate 111. The transistor 210 can include an active layer 211, a gate electrode 212, and source and drain electrodes 213 and 214. Although FIGS. 5A and 5B illustrate that the transistor 210 is formed in a top gate mode in which the gate electrode 212 is disposed above the active layer 211, the present disclosure is not limited thereto. For example, the transistor 210 can be formed in a bottom gate mode in which the gate electrode 212 is disposed below the active layer 211, or can be formed in a double gate mode in which the gate electrode 212 is disposed above and below the active layer 211. Alternatively, the transistor 210 can be a portion of CMOS circuit in which gate lines, data lines and a transistor are integrated on the silicon wafer substrate by a CMOS process.

The active layer 211 can be formed on the first substrate 111. The active layer can be formed of a silicon based semiconductor material or an oxide based semiconductor material. The gate insulating film 113 can be formed on the active layer 211. The gate insulating film 113 can be formed an inorganic film, for example, a silicon oxide (SiOx) film, a silicon nitride (SiNx) film, or a multi-layered film of SiOx and SiNx. The gate electrode 212 can be formed on the gate insulating film 113.

The gate electrode 112 can be overlapped with the active layer 211 by interposing the gate insulating film 113 therebetween. The gate electrode 212, for example, can be made of at least one metal or alloy of Al, Mo, Ti and Cu, or can be formed of, but not limited to, a single layer or a multi-layered structure of the above metal or material.

The inter-layer dielectric film 114 can be formed on the gate electrode 212. The inter-layer dielectric film 114 can be made of, but not limited to, the same inorganic insulating material as that of the gate insulating film 113.

The source and drain electrodes 213 and 214 can be disposed to be spaced apart from each other on the inter-layer dielectric film 114. The source and drain electrodes 213 and 214 can be connected to one end area and the other end area of the active layer 211 through a contact hole that passes through the inter-layer dielectric film 114. The source and drain electrodes 213 and 214 can be made of at least one metal or alloy of Al, Mo, Ti and Cu, or can be formed of, but not limited to, a single layer or a multi-layered structure of the above metal or material.

The planarization film 115 can be formed on the transistor 210. The planarization film 115 can serve to planarize the upper portion of the first substrate 111. The connection electrode 220 can be formed on the planarization film 115. The connection electrode 220 can serve to electrically connect the transistor 210 with the first electrode 230. A first contact hole CNT1 that exposes the upper surface of the source and drain electrodes 213 and 214 of the transistor 210 can be formed on the planarization film 115 below the connection electrode 220. The source and drain electrodes 213 and 214 of the transistor 210 can electrically connected with the connection electrode 220 through the first contact hole CNT1.

The insulating film 116 can be formed on the connection electrode 220. The first electrode 230 can be formed by interposing the insulating film 116. A second contact hole CNT2 that exposes the upper surface of the connection electrode 220 can be formed on the insulating film 116. The connection electrode 220 can be connected with the first electrode 230 through the second contact hole CNT2. As a result, the first electrode 230 can electrically be connected with the source and drain electrodes 213 and 214 of the transistor 210 through the first contact hole CNT1, the connection electrode 220 and the second contact hole CNT2.

According to various embodiments of the present disclosure, the second contact hole CNT2 formed in the insulating film 116 for the first electrode 230 can be formed with a width wider than that of the first contact hole CNT1 formed in the planarization film 115 for the connection electrode 220. The first electrode 230 can be provided with a contact area CTA that covers the second contact hole CNT2 wider than the first contact hole CNT1. In the contact area CNT of the first electrode 230, a protrusion 235 vertically protruded from the upper surface of the first electrode 230 can be on a boundary surface of the second contact hole CNT2. A more detailed structure of the protrusion 235 will be described with reference to FIGS. 6A to 6C.

According to one embodiment of the present disclosure, as shown in FIG. 5A, the first contact hole CNT1 and the second contact hole CNT2 can be formed to be overlapped with each other. Also, the connection electrode 220 can be formed to be patterned for only a portion on the planarization film 115 like the first electrode 230.

According to another embodiment of the present disclosure, as shown in FIG. 5B, the first contact hole CNT1 and the second contact hole CNT2 can be formed not to be overlapped with each other.

The fence film 240 that covers the corner of the first electrode 230 can be formed at an edge area of the first electrode 230. For example, the fence film 240 that covers a portion of the side and the upper surface of the first electrode 230 can be formed. The fence film 240 can cover the first electrode 230 disposed in the non-emission area NEA, and the adjacent pixels GP can be partitioned by the fence film 240. The fence film 240 can be extended to cover the contact area CTA of the first electrode 230. The fence film 240 can be formed to cover the contact area CTA of the first electrode 230, whereby overcurrent of the organic light emitting layer 250 to be formed on the first electrode 230 and the fence film 240 can be prevented from occurring.

The organic light emitting layer 250 can be formed on the first electrode 230 and the fence film 240. The organic light emitting layer 250 can include a hole transporting layer, a light emitting layer, and an electron transporting layer. In this case, if a voltage is applied to the first electrode 230 and the second electrode 260, holes and electrons move to the light emitting layer through the hole transporting layer and the electron transporting layer and are combined with each other in the light emitting layer to emit light.

If the organic light emitting layer 250 is a white light emitting layer, a tandem structure of two or more stacks can be formed. Each of the stacks can include a hole transporting layer, at least one light emitting layer, and an electron transporting layer. Also, the charge generating layer can be formed between the stacks. The charge generating layer can include an N-type charge generating layer disposed to be adjacent to the lower stack and a P-type charge generating layer formed on the N-type charge generating layer and disposed to be adjacent to the upper stack. The N-type charge generating layer can inject electrons into the lower stack, and the P-type charge generating layer can inject holes into the upper stack. The N-type charge generating layer can be comprised of an organic layer doped with alkali metal such as Li, Na, K, or Cs or alkali earth metal such as Mg, Sr, Ba, or Ra. The p-type charge generating layer can be made by doping a dopant on an organic material that is capable of transporting holes.

The organic light emitting layer 250 can be formed even on the contact area CTA of the first electrode 230. For example, the organic light emitting layer 250 can be formed on a protrusion 235 formed on the boundary surface of the second contact hole CNT2 in the contact area CTA of the first electrode 230 and a path along an inner space based on the second contact hole CNT2 inside the protrusion 235. The organic light emitting layer 250 can be formed by a deposition process or a solution process. If the organic light emitting layer 250 is formed by a deposition process, the organic light emitting layer 250 can be formed by an evaporation method. The film formed by the evaporation method does not have good step coverage characteristic. Therefore, the organic light emitting layer 250 can be formed such that its thickness from the sidewall of the contact area CTA of the first electrode 230 is thinner than the thickness from the bottom of the contact area CTA. For example, the organic light emitting layer 250 passes through the contact area CTA of the first electrode 230 and thus can allow a length of a current leakage path to be longer than a case that there is no contact area CTA of the first electrode 230. Also, since the organic light emitting layer 250 at the sidewall of the contact area CTA can be formed to be disconnected from the organic light emitting layer 250 on the bottom of the contact area CTA, a leakage current through the organic light emitting layer 250 can be minimized.

The second electrode 260 can be formed on the organic light emitting layer 250. The second electrode 260 can be a common layer commonly formed for the respective pixels RP, GP and BP. The second electrode 260 can be formed of a transparent conductive material (TCP) such as ITO and IZO or a semi-transmissive conductive material such as Mg, Ag, or alloy of Mg and Ag. If the second electrode 260 is formed of a semi-transmissive conductive material, a micro cavity effect can be obtained.

The second electrode 260 can be formed even on the contact area CTA of the first electrode 230. The second electrode 260 can be formed by a physics vapor deposition method such as sputtering. The film formed by a physics vapor deposition method such as sputtering can have excellent step coverage characteristic. The second electrode 260 can be formed on an air gap formed by the organic light emitting layer 250 in the contact area CTA of the first electrode 230.

The encapsulation layer 117 can be formed on the second electrode 260. The encapsulation layer 117 can serve to prevent oxygen or water from being permeated into the organic light emitting layer 250 and the second electrode 260. To this end, the encapsulation layer 117 can include at least one inorganic film and at least one organic film.

The color filter layer GC can be formed on the encapsulation layer 117. The color filter layer GC can be disposed in such a manner that color filter layers of a single color, for example, green color filter layers GC can continuously be disposed in an area where the pixels GP of the same color are continuous.

Figure 6A:
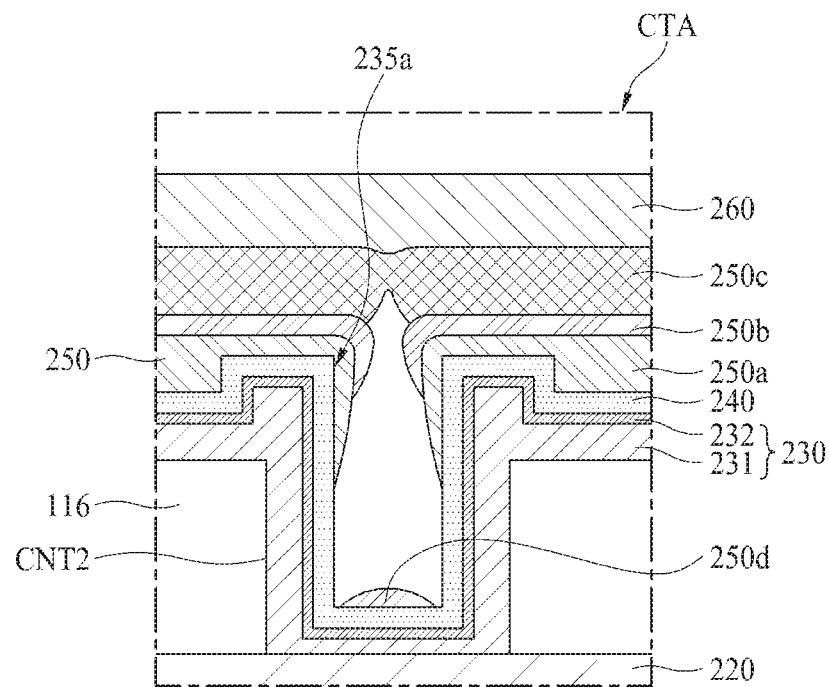
FIGS. 6A to 6C are enlarged views illustrating various examples of an area A of FIGS. 5A and 5B.
Figure 6B:
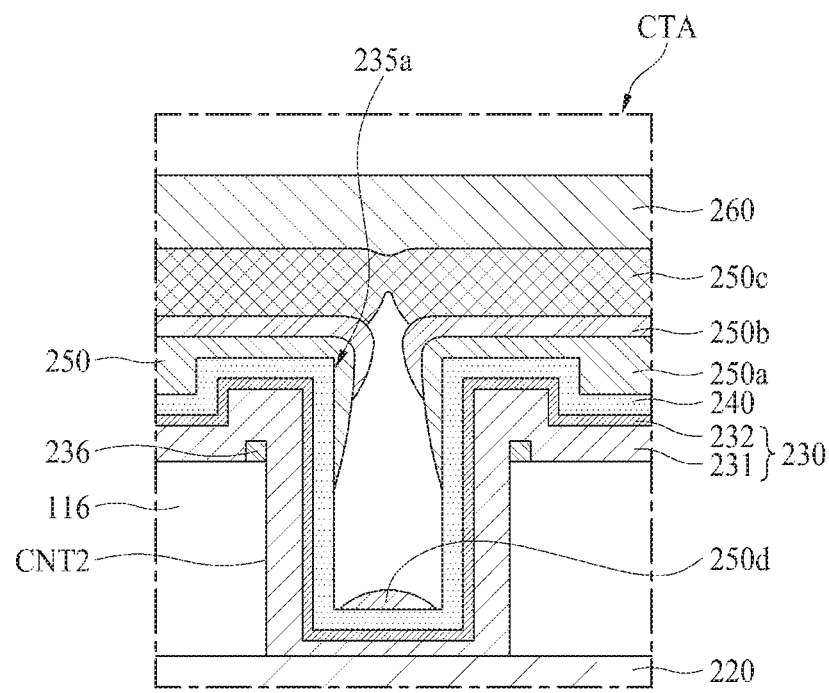
Figure 6C:
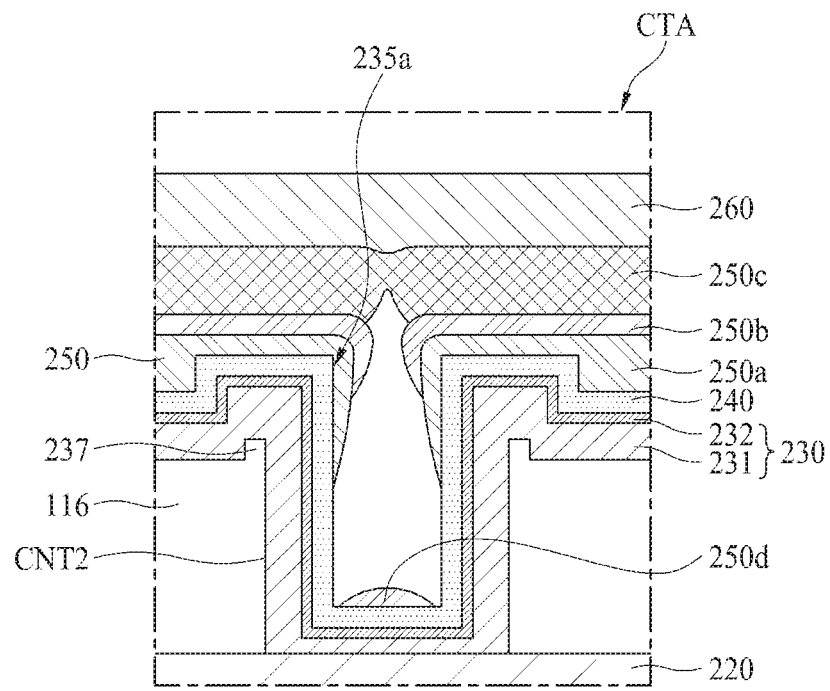

FIGS. 6A to 6C are enlarged views illustrating various examples of an area A of FIGS. 5A and 5B. FIGS. 6A to 6C show various embodiments for a contact area CTA improved to minimize a leakage current. Various embodiments of the contact area CTA shown in FIGS. 6A to 6C can equally be applied to FIGS. 3A and 3B, and vice versa. Also, the example of FIG. 6A can be replaced with FIG. 6B or 6C.

Referring to FIG. 6A, the first electrode 230 according to one embodiment of the present disclosure can include a reflective electrode layer 231, a transparent electrode layer 232, and a protrusion 235a.

The reflective electrode layer 231 can be formed on the insulating film 116. A second contact hole CNT2 that exposes the upper surface of the connection electrode 220 can be formed in the insulating film 116. The reflective electrode layer 231 can be formed to cover the second contact hole CNT2 of the insulating film 116. The reflective electrode layer 231 can be formed to cover the inner space based on the second contact hole CNT2. The reflective electrode layer 231 can be formed by a physics vapor deposition method such as sputtering. The reflective electrode layer 231 can be provided with a protrusion 235a vertically protruded from the boundary surface of the second contact hole CNT2. To this end, the reflective electrode layer 231 can be formed on the insulating film 116 and the second contact hole CNT2 at a thickness corresponding to that of the protrusion 235a and then can maintain the thickness of the protrusion 235a vertically protruded from the boundary surface of the second contact hole CNT2 and etch the thickness of the other area by using a half tone mask, thereby forming the protrusion 235a on the boundary surface of the second contact hole CNT2.

The transparent electrode layer 232 can be formed on the reflective electrode layer 231 at a uniform thickness. The transparent electrode layer 232 can be formed by a physics vapor deposition method such as sputtering. Since the film formed by a physics vapor deposition method such as sputtering has excellent step coverage characteristic, the thickness of the protrusion 235a can be increased as much as the deposited thickness of the transparent electrode layer 232. At this time, the reflective electrode layer 231 can be formed to be thicker than the transparent electrode layer 232. The transparent electrode layer 232 can be formed with a thickness thinner than a height of the protrusion 235a initially formed on the reflective electrode layer 231. For example, the thickness of the transparent electrode layer from the upper surface of the reflective electrode layer 231 can be thinner than the height of the protrusion from the upper surface of the reflective electrode layer 231.

The organic light emitting layer 250 can be formed on the transparent electrode layer 232 of the first electrode 230. The organic light emitting layer 250 can be formed even on the protrusion 235a of the first electrode 230 provided with the reflective electrode layer 231 and the transparent electrode layer 232, which are deposited in due order, and the contact area CTA defined by the second contact hole CNT2. For example, the organic light emitting layer 250 can be formed on the protrusion 235a formed on the boundary surface of the second contact hole CNT2 in the contact area CTA of the first electrode 230 and a path along an inner space based on the second contact hole CNT2 inside the protrusion 235a. Also, the organic light emitting layer 250 can be formed such that its thickness at the sidewall of the contact area CTA of the first electrode 230 can be thinner than the thickness on the bottom of the contact area CTA. Also, the organic light emitting layer 250 can have a multi-layered structure in which a plurality of layers are deposited. For example, the organic light emitting layer 250 can include a hole transporting layer 250a, a light emitting layer 250b and an electron transporting layer 250c. The hole transporting layer 250a of the organic light emitting layer 250 can be formed at the side of the trench T, and a residual material 250d of the organic light emitting layer 250 can be formed on the bottom of the trench T. For example, the organic light emitting layer 250 can have both sides disconnected by interposing the contact area CTA of the first electrode 230.

The second electrode 260 can be formed on the organic light emitting layer 250. The second electrode 260 can be formed even on the contact area CTA of the first electrode 230. The second electrode 260 can be formed on an air gap formed by the organic light emitting layer 250 in the contact area CTA of the first electrode 230.

Referring to FIG. 6B, the first electrode 230 according to another embodiment of the present disclosure can include a reflective electrode layer 231, a transparent electrode layer 232, and a protrusion 235b. The reflective electrode layer 231 can be formed on the insulating film 116. The second contact hole CNT2 that exposes the upper surface of the connection electrode 220 can be formed in the insulating film 116. The reflective electrode layer 231 can be formed to cover the second contact hole CNT2. The reflective electrode layer 231 can be formed to cover the inner space based on the second contact hole CNT2. The reflective electrode layer 231 can be formed by a physics vapor deposition method such as sputtering. The reflective electrode layer 231 can be provided with a protrusion 235b vertically protruded from the boundary surface of the second contact hole CNT2. To this end, the insulating film 116 can be formed such that an organic block 236 can be disposed on the boundary surface of the second contact hole CNT2 in the process of forming the second contact hole CNT2. The organic block 236 can be made of a material different from that of the insulating film 116. For example, a photoresist pattern having an opened position where the second contact hole CNT2 will be formed can be formed on the insulating film 116, and the insulating film 116 exposed without being covered by the photoresist pattern can be etched to form the second contact hole CNT2. When the photoresist pattern is removed, the organic block 236 can remain on the boundary surface of the second contact hole CNT2. Then, the reflective electrode layer 231 can be formed on the second contact hole CNT2 having the organic block 236 on the boundary surface with the insulating film 116. As a result, the reflective electrode layer 231 can allow the protrusion 235b to be formed on the boundary surface of the second contact hole CNT2.

The transparent electrode layer 232 can be formed on the reflective electrode layer 231 at a uniform thickness. The transparent electrode layer 232 can be formed by a physics vapor deposition method such as sputtering. Since the film formed by a physics vapor deposition method such as sputtering has excellent step coverage characteristic, the thickness of the protrusion 235b can be increased as much as the deposited thickness of the transparent electrode layer 232. At this time, the reflective electrode layer 231 can be formed to be thicker than the transparent electrode layer 232. The transparent electrode layer 232 can be formed with a thickness thinner than a height of the protrusion 235b initially formed on the reflective electrode layer 231.

The organic light emitting layer 250 can be formed on the transparent electrode layer 232 of the first electrode 230. The organic light emitting layer 250 can be formed even on the protrusion 235b of the first electrode 230 provided with the reflective electrode layer 231 and the transparent electrode layer 232, which are deposited in due order, and the contact area CTA defined by the second contact hole CNT2. For example, the organic light emitting layer 250 can be formed on the protrusion 235b formed on the boundary surface of the second contact hole CNT2 in the contact area CTA of the first electrode 230 and a path along an inner space based on the second contact hole CNT2 inside the protrusion 235b. Also, the organic light emitting layer 250 can be formed such that its thickness at the sidewall of the contact area CTA of the first electrode 230 can be thinner than the thickness on the bottom of the contact area CTA.

The second electrode 260 can be formed on the organic light emitting layer 250. The second electrode 260 can be formed even on the contact area CTA of the first electrode 230. The second electrode 260 can be formed on an air gap formed by the organic light emitting layer 250 in the contact area CTA of the first electrode 230.

Referring to FIG. 6C, the first electrode 230 according to another embodiment of the present disclosure can include a reflective electrode layer 231, a transparent electrode layer 232, and a protrusion 235a. The reflective electrode layer 231 can be formed on the insulating film 116. The second contact hole CNT2 that exposes the upper surface of the connection electrode 220 can be formed in the insulating film 116. The reflective electrode layer 231 can be formed to cover the second contact hole CNT2 of the insulating film 116. The reflective electrode layer 231 can be formed to cover the inner space based on the second contact hole CNT2. The reflective electrode layer 231 can be formed by a physics vapor deposition method such as sputtering. The reflective electrode layer 231 can be provided with a protrusion 235c vertically protruded from the boundary surface of the second contact hole CNT2. To this end, the insulating film 116 can be provided with a convex portion 237 partially extended from the insulating film 116 on the boundary surface of the second contact hole CNT2 in the process of forming the second contact hole CNT2. For example, the convex portion 237 of the insulating film 115 can be formed on the boundary surface of the second contact hole CNT2 by etching the second contact hole CNT2 by using a half tone mask to allow the thickness of the convex portion 237 partially extended from the insulating film 116 to remain on the boundary surface of the second contact hole CNT2. Then, the reflective electrode layer 231 can be formed on the insulating film 116 having the convex portion 237 on the boundary surface of the second contact hole CNT2. As a result, the reflective electrode layer 231 can allow the protrusion 235c to be formed on the boundary surface of the second contact hole CNT2.

The transparent electrode layer 232 can be formed on the reflective electrode layer 231 at a uniform thickness. The transparent electrode layer 232 can be formed by a physics vapor deposition method such as sputtering. Since the film formed by a physics vapor deposition method such as sputtering has excellent step coverage characteristic, the thickness of the protrusion 235c can be increased as much as the deposited thickness of the transparent electrode layer 232. At this time, the reflective electrode layer 231 can be formed to be thicker than the transparent electrode layer 232. The transparent electrode layer 232 can be formed with a thickness thinner than a height of the protrusion 235c initially formed on the reflective electrode layer 231.

The organic light emitting layer 250 can be formed on the transparent electrode layer 232 of the first electrode 230. The organic light emitting layer 250 can be formed even on the protrusion 235c of the first electrode 230 provided with the reflective electrode layer 231 and the transparent electrode layer 232, which are deposited in due order, and the contact area CTA defined by the second contact hole CNT2. For example, the organic light emitting layer 250 can be formed on the protrusion 235c formed on the boundary surface of the second contact hole CNT2 in the contact area CTA of the first electrode 230 and a path along an inner space based on the second contact hole CNT2 inside the protrusion 235c. Also, the organic light emitting layer 250 can be formed such that its thickness at the sidewall of the contact area CTA of the first electrode 230 can be thinner than the thickness on the bottom of the contact area CTA.

The second electrode 260 can be formed on the organic light emitting layer 250. The second electrode 260 can be formed even on the contact area CTA of the first electrode 230. The second electrode 260 can be formed on an air gap formed by the organic light emitting layer 250 in the contact area CTA of the first electrode 230.

In various embodiments of the present disclosure described as above, a trench structure is applied between pixels emitting light of different colors and an improved contact area is applied between pixels emitting light of the same color. However, the present disclosure is not limited to the above embodiments, and the trench structure can be excluded between the pixels emitting light of different colors as well as the pixels emitting light of the same color and the improved contact area according to various embodiments of the present disclosure can be applied for shielding of a leakage current.

Figure 7A:
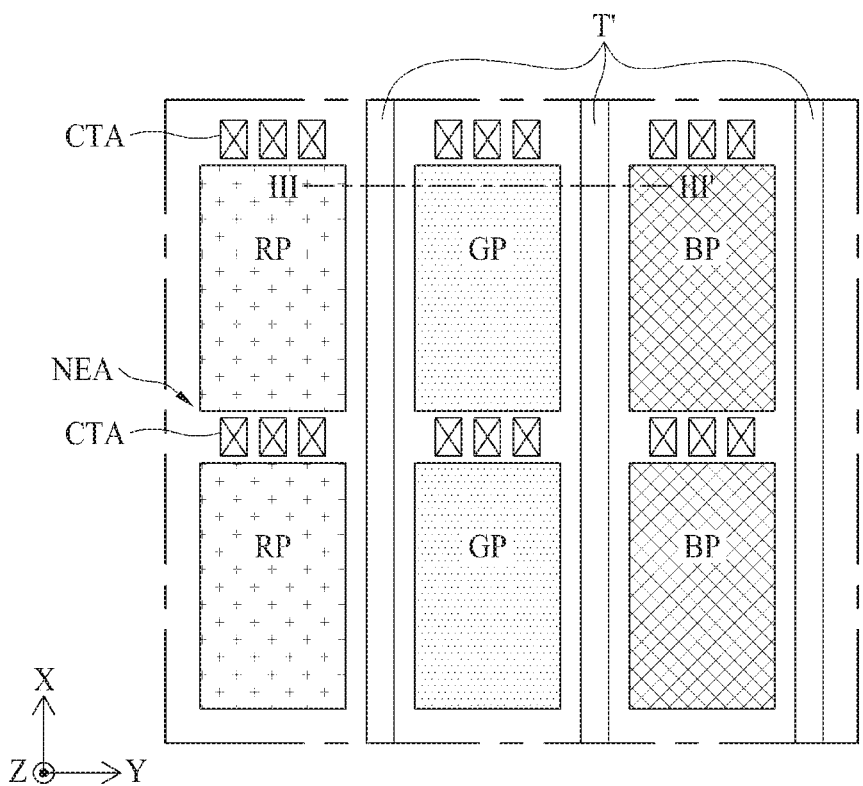
FIG. 7A is a plane view illustrating subpixels of a display area according to various embodiments of the present disclosure.
Figure 7B:
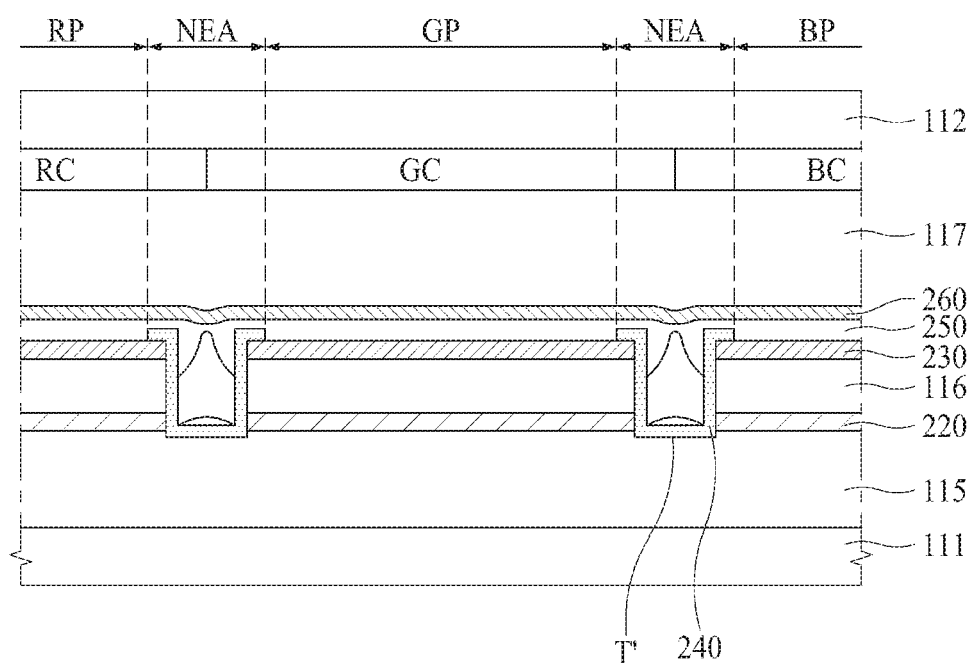
FIGS. 7B and 7C illustrate various examples of cross-sectional views taken along line III-III' of FIG. 7A.
Figure 7C:
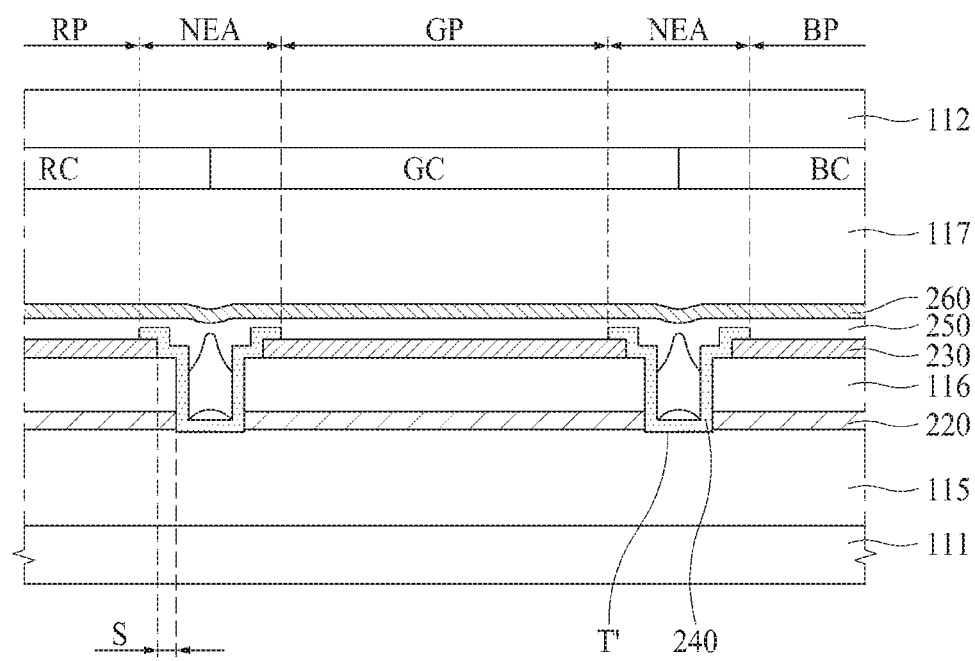

FIG. 7A is a plane view illustrating subpixels of a display area according to various embodiments of the present disclosure, and FIGS. 7B and 7C are cross-sectional views illustrating various examples of view taken along line III-III' of FIG. 7A.

Referring to FIGS. 7A to 7C, each of the pixels RP, GP and BP can include at least one transistor and an organic light emitting diode.

A trench T can be formed among the pixels RP, GP and BP. At this time, the trench T can be formed in a step difference area between the first electrode 230 and the connection electrode 220.

Referring to FIG. 7B, a trench T' having a single layer can be formed in the first electrode 230 and the insulating film 116 in a straight line. For example, the connection electrode 220 can be formed on an entire surface of the planarization film 115, the insulating film 116 can be formed on the connection electrode 220, and the first electrode 230 which is patterned can be formed on the insulating film 116. The trench T' can be formed between the first electrodes 230 by etching the insulating film 116 using the first electrode 230 as a mask pattern.

Referring to FIG. 7C, a trench T' having a single layer S can be formed in the first electrode 230 and the insulating film 116. For example, the connection electrode 220 can be formed on the entire surface of the planarization film 115, the insulating film 116 can be formed on the connection electrode 220, and the first electrode 230 which is patterned can be formed on the insulating film 116. When the insulating film 116 is etched using the first electrode 230 as a mask pattern, an etching ratio can be controlled or a separate mask can be added, whereby the trench T' provided with a single layer S can be formed in the insulating film 116 and the first electrode 230. In this case, since a width between the first electrodes 230 can be widened, a disconnection of the organic light emitting layer 250 formed on the first electrode 230 can be formed more effectively.

Figure 8A:
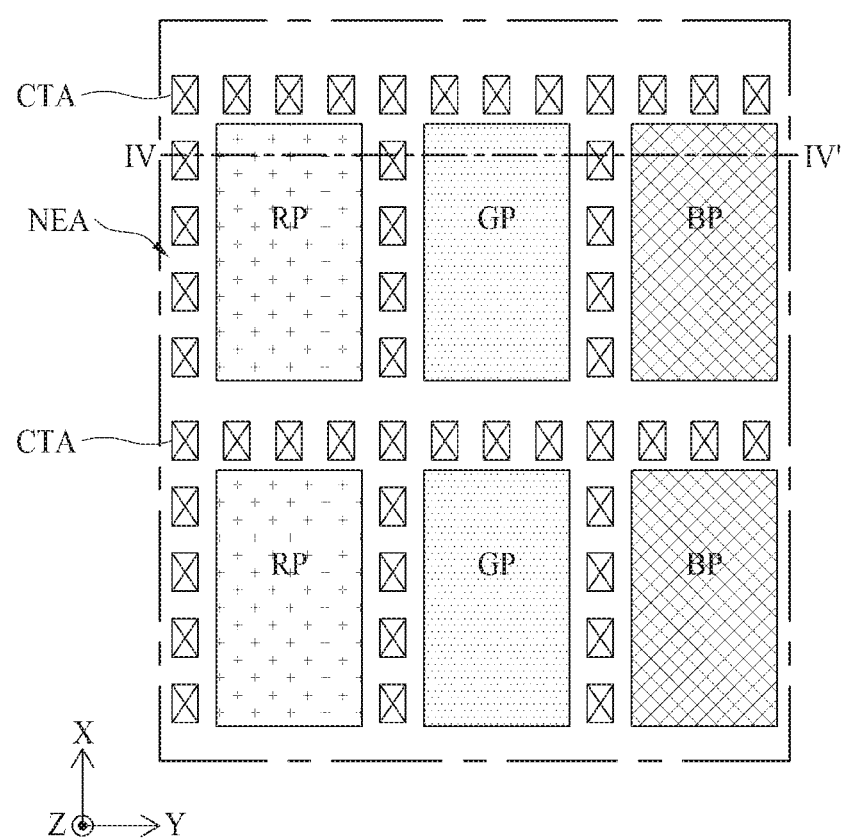
FIG. 8A is a plane view illustrating subpixels of a display area according to various embodiments of the present disclosure.
Figure 8B:
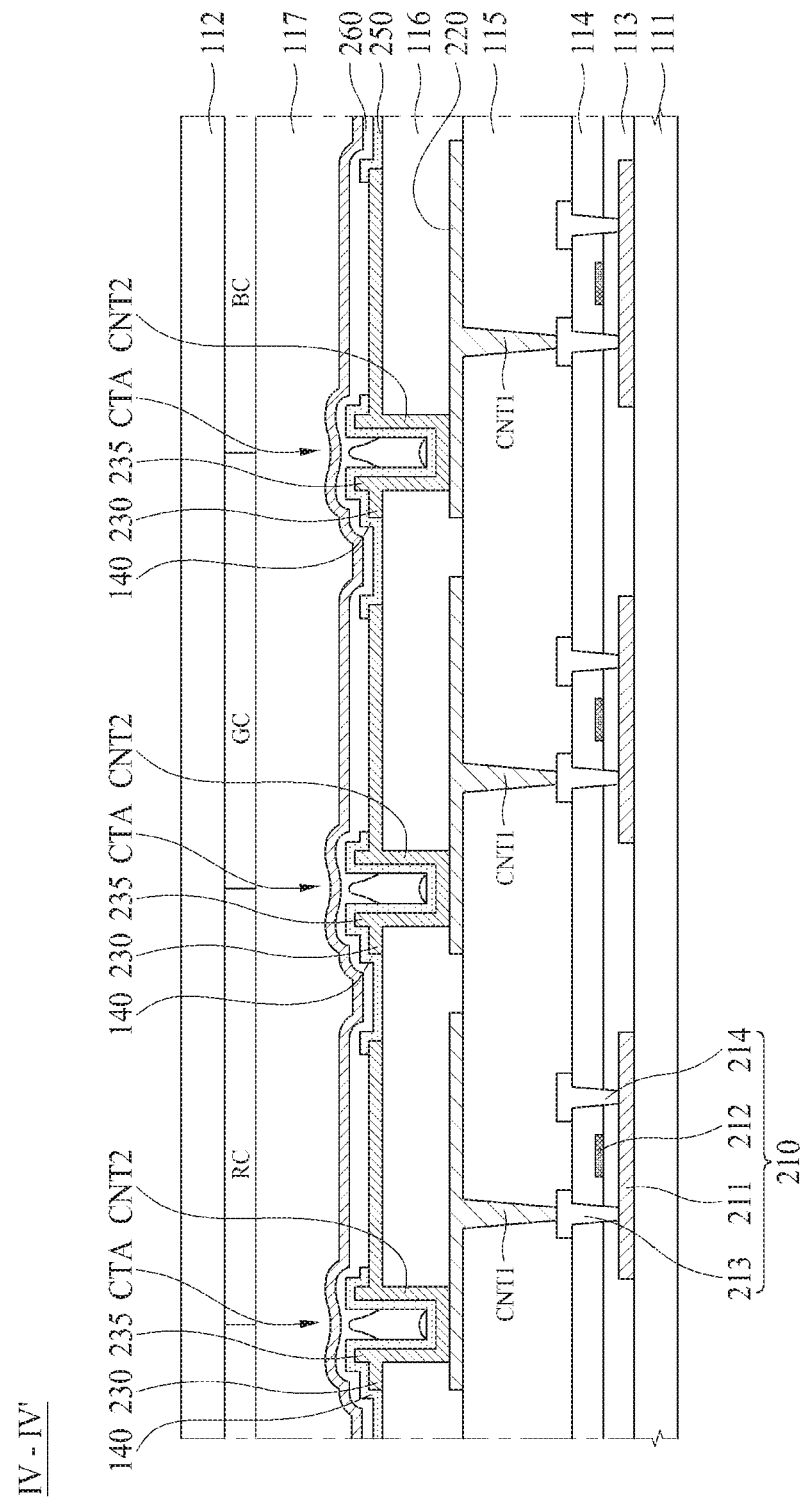
FIG. 8B illustrate an example of a cross-sectional view taken along line IV-IV' of FIG. 8A.

FIG. 8A is a plane view illustrating subpixels of a display area according to various embodiments of the present disclosure, and FIG. 8B is a cross-sectional view illustrating an example of view taken along line IV-IV' of FIG. 8A. FIG. 8A can be similar to FIGS. 3A, 3B, and 7A except that the contact area CTA is added in a vertical direction and the trench can be omitted.

Referring to FIGS. 8A and 8B, each of the pixels RP, GP and BP can include at least one transistor and an organic light emitting diode.

A trench is not formed among the pixels RP, GP and BP, and a contact area CTA can be formed in not only a horizontal direction but also a vertical direction. Although FIG. 8A shows that a plurality of contact area CTA are disposed, the present discourse is not limited thereto. At least one contact area CTA can be embodied to be extended longitudinally in a horizontal direction and/or a vertical direction of the pixel.

Referring to FIG. 8B, the contact area CTA applied between the pixels of the same color in the aforementioned embodiments is applied between the pixels of different colors, and its structure can substantially be the same as the aforementioned contact area CAT.

For example, in the embodiment of FIGS. 8A and 8B, the existing trench structure can be removed to form a narrower interval between the pixels, and as a result, a leakage current can be caused and compensated by the contact area CTA.

The organic light emitting display apparatus according to one or more embodiments of the present disclosure can be described as follows.

The organic light emitting display apparatus according to various embodiments of the present disclosure can comprise an insulating film disposed on a substrate, a first electrode disposed on the insulating film, an organic light emitting layer disposed on the first electrode, and a second electrode disposed on the organic light emitting layer, wherein the first electrode can be provided with a contact area that covers a contact hole passing through the insulating film, and a protrusion vertically protruded from an upper surface of the first electrode on a boundary surface of the contact hole.

In the organic light emitting display apparatus according to various embodiments of the present disclosure can further comprise a fence film formed to cover the contact area and an edge area of the first electrode.

In the organic light emitting display apparatus according to various embodiments of the present disclosure, the fence film, the organic light emitting layer and the second electrode can sequentially be disposed in the contact area of the first electrode, and the organic light emitting layer at a sidewall of the contact area of the first electrode and the organic light emitting layer on a bottom of the contact area can be disconnected from each other.

In the organic light emitting display apparatus according to various embodiments of the present disclosure, the first electrode can include a reflective electrode layer formed on the insulating film, and a transparent electrode layer formed on the reflective electrode layer.

In the organic light emitting display apparatus according to various embodiments of the present disclosure, the reflective electrode layer can have a thickness thicker than that of the transparent electrode layer.

In the organic light emitting display apparatus according to various embodiments of the present disclosure, a thickness of the transparent electrode layer from an upper surface of the reflective electrode layer can be thinner than a height of the protrusion from the upper surface of the reflective electrode layer.

The organic light emitting display apparatus according to various embodiments of the present disclosure can further comprise a transistor disposed on the substrate, and a planarization film disposed on the transistor.

The organic light emitting display apparatus according to various embodiments of the present disclosure can further comprise a connection electrode disposed between the planarization film and the insulating film and connected with the contact area of the first electrode through the contact hole of the insulating film.

In the organic light emitting display apparatus according to various embodiments of the present disclosure, the connection electrode can electrically be connected with the transistor through a lower contact hole passing through the planarization film, and can electrically be connected with the first electrode through the contact area that covers the contact hole passing through the insulating film.

In the organic light emitting display apparatus according to various embodiments of the present disclosure, the contact area of the first electrode and the lower contact hole of the connection electrode can be overlapped with each other.

In the organic light emitting display apparatus according to various embodiments of the present disclosure, the contact area of the first electrode and the lower contact hole of the connection electrode may not be overlapped with each other.

In the organic light emitting display apparatus according to various embodiments of the present disclosure, the substrate can further include a plurality of subpixels having an emission area and a non-emission area surrounding the emission area, and a trench formed in the non-emission area between the subpixels adjacent to each other.

In the organic light emitting display apparatus according to various embodiments of the present disclosure, the organic light emitting layers corresponding to the adjacent subpixels can be separated from each other on the trench.

In the organic light emitting display apparatus according to various embodiments of the present disclosure, an organic block can be disposed on a boundary surface with the contact hole on the insulating film, and the protrusion of the first electrode can be formed to correspond to a height of the organic block.

In the organic light emitting display apparatus according to various embodiments of the present disclosure, the organic block can be made of a material different from that of the insulating film.

In the organic light emitting display apparatus according to various embodiments of the present disclosure, the insulating film can be provided with a convex portion on the boundary surface with the contact hole, and the protrusion of the first electrode can be formed to correspond to a height of the convex portion.

A method for manufacturing an organic light emitting display apparatus according to various embodiments of the present disclosure can comprise forming a transistor disposed on a substrate, forming a planarization film having a lower contact hole on the transistor, forming a connection electrode electrically connected with the transistor through the lower contact hole on the planarization film by patterning, forming a first electrode having a contact area covering the contact hole on the insulating film and a protrusion vertically protruded on a boundary surface of the contact hole, forming a fence film on the insulating film on which the first electrode is patterned, to cover an edge area of the first electrode, forming an organic light emitting layer on the first electrode and the fence film, and forming a second electrode on the organic light emitting layer.

In the method for manufacturing an organic light emitting display apparatus according to various embodiments of the present disclosure, the step of forming the first electrode to be patterned can include forming a photoresist pattern on the insulating film, etching the insulating film exposed without being covered by the photoresist pattern to form the contact hole, removing the photoresist pattern, forming a reflective electrode layer on the insulating film, forming a protrusion vertically protruded from the boundary surface of the contact hole on the reflective electrode layer by using a half tone mask, and forming a transparent electrode layer on the reflective electrode layer having the protrusion.

In the method for manufacturing an organic light emitting display apparatus according to various embodiments of the present disclosure, the step of forming the first electrode to be patterned can include forming a photoresist pattern on the insulating film, etching the insulating film exposed without being covered by the photoresist pattern to form the contact hole, removing the photoresist pattern while making sure of an organic block on the boundary surface of the contact hole, forming a reflective electrode layer on the insulating film, and forming a transparent electrode layer on the reflective electrode layer, wherein the reflective electrode layer can be provided with a protrusion vertically protruded from the boundary surface of the contact hole by the organic block remaining on the boundary surface of the contact hole.

In the method for manufacturing an organic light emitting display apparatus according to various embodiments of the present disclosure, the organic block can be made of a material different from that of the insulating film.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. An organic light emitting display apparatus comprising:
   an insulating film disposed on a substrate;
   a first electrode disposed on the insulating film;
   an organic light emitting layer disposed on the first electrode; and
   a second electrode disposed on the organic light emitting layer,
   wherein the first electrode is provided with a contact area that covers a contact hole passing through the insulating film, and a protrusion vertically protruded from an upper surface of the first electrode on a boundary surface of the contact hole, and
   wherein the organic light emitting layer at a sidewall of the contact area of the first electrode and the organic light emitting layer on a bottom of the contact area of the first electrode are disconnected from each other.

2. The organic light emitting display apparatus of claim 1, further comprising a fence film disposed to cover the contact area and an edge area of the first electrode.

3. The organic light emitting display apparatus of claim 2, wherein the fence film, the organic light emitting layer and the second electrode are sequentially disposed in the contact area of the first electrode.

4. The organic light emitting display apparatus of claim 1, wherein the first electrode includes:
   a reflective electrode layer disposed on the insulating film; and
   a transparent electrode layer disposed on the reflective electrode layer.

5. The organic light emitting display apparatus of claim 4, wherein the reflective electrode layer has a thickness thicker than a thickness of the transparent electrode layer.

6. The organic light emitting display apparatus of claim 5, wherein a thickness of the transparent electrode layer from an upper surface of the reflective electrode layer is thinner than a height of the protrusion from the upper surface of the reflective electrode layer.

7. The organic light emitting display apparatus of claim 1, further comprising:
   a transistor disposed on the substrate; and
   a planarization film disposed on the transistor.

8. The organic light emitting display apparatus of claim 7, further comprising a connection electrode disposed between the planarization film and the insulating film and connected with the contact area of the first electrode through the contact hole of the insulating film.

9. The organic light emitting display apparatus of claim 8, wherein the connection electrode is electrically connected with the transistor through a lower contact hole passing through the planarization film, and
   the connection electrode is electrically connected with the first electrode through the contact area that covers the contact hole passing through the insulating film.

10. The organic light emitting display apparatus of claim 9, wherein the contact area of the first electrode and the lower contact hole of the connection electrode overlap with each other.

11. The organic light emitting display apparatus of claim 9, wherein the contact area of the first electrode and the lower contact hole of the connection electrode do not overlap with each other.

12. The organic light emitting display apparatus of claim 1, wherein the substrate further includes a plurality of subpixels having an emission area and a non-emission area surrounding the emission area, and a trench disposed in the non-emission area between the subpixels adjacent to each other.

13. The organic light emitting display apparatus of claim 12, wherein organic light emitting layers corresponding to the adjacent subpixels are separated from each other on the trench.

14. The organic light emitting display apparatus of claim 1, wherein an organic block is disposed on a boundary surface with the contact hole on the insulating film, and
   the protrusion of the first electrode is disposed to correspond to a height of the organic block.

15. The organic light emitting display apparatus of claim 14, wherein the organic block is made of a material different from a material of the insulating film.

16. The organic light emitting display apparatus of claim 1, wherein the insulating film is provided with a convex portion on the boundary surface with the contact hole, and
   the protrusion of the first electrode is disposed to correspond to a height of the convex portion.

* * * * *